(12) United States Patent
Cheng et al.

(10) Patent No.: US 8,167,524 B2
(45) Date of Patent: May 1, 2012

(54) HANDLING SYSTEM FOR INSPECTING AND SORTING ELECTRONIC COMPONENTS

(75) Inventors: Chi Wah Cheng, New Territories (HK); Wang Lung Alan Tse, North Point (HK); Tim Wai Tony Mak, Chai Wan (HK); Lap Kei Eric Chow, Kowloon (HK)

(73) Assignee: ASM Assembly Automation Ltd, Hong Kong (HK)

( * ) Notice: Subject to any disclaimer, the term of this patent is extended or adjusted under 35 U.S.C. 154(b) by 535 days.

(21) Appl. No.: 11/941,372

(22) Filed: Nov. 16, 2007

(65) Prior Publication Data
US 2009/0129899 A1    May 21, 2009

(51) Int. Cl.
*B65H 9/08* (2006.01)

(52) U.S. Cl. ............. 414/226.01; 414/222.13; 414/763; 356/237.5

(58) Field of Classification Search ............. 414/222.01, 414/222.09, 226.01, 567, 761, 763, 788.7, 414/222.13; 29/742; 356/237.4–237.5; 198/345.1; 294/65
See application file for complete search history.

(56) References Cited

U.S. PATENT DOCUMENTS

| | | | | |
|---|---|---|---|---|
| 4,082,188 A | * | 4/1978 | Grimmell et al. | 209/580 |
| 4,135,619 A | * | 1/1979 | Cerboni | 198/471.1 |
| 4,884,696 A | * | 12/1989 | Peleg | 209/545 |
| 5,336,029 A | * | 8/1994 | Kato et al. | 414/217 |
| 5,862,646 A | * | 1/1999 | Orillo | 53/53 |
| 6,154,954 A | * | 12/2000 | Seto et al. | 29/740 |
| 6,297,075 B1 | * | 10/2001 | Odajima et al. | 438/110 |
| 6,439,631 B1 | * | 8/2002 | Kress | 294/65 |
| 6,446,354 B1 | | 9/2002 | Na | 34/236 |
| 6,655,045 B2 | | 12/2003 | Cheung et al. | 34/406 |
| 6,725,532 B1 | * | 4/2004 | Okada et al. | 414/752.1 |
| 6,773,543 B2 | * | 8/2004 | Summers | 156/344 |
| 7,190,446 B2 | | 3/2007 | Cheng et al. | 356/237.1 |
| 2003/0161711 A1 | * | 8/2003 | Kwan | 414/759 |
| 2006/0242821 A1 | * | 11/2006 | Burger | 29/740 |
| 2007/0209198 A1 | * | 9/2007 | Niklas et al. | 29/833 |

FOREIGN PATENT DOCUMENTS
WO    WO 2005078768 A1  *  8/2005

* cited by examiner

*Primary Examiner* — Jonathan Snelting
(74) *Attorney, Agent, or Firm* — Ostrolenk Faber LLP

(57) ABSTRACT

A semiconductor package handling system is provided comprising a package holder for receiving and holding singulated semiconductor packages, and a first inspection device which is arranged and configured to inspect a first surface of the packages while they are being held by the package holder. An offloading device receives the packages from the package holder and conveys them packages to an offloader, and a second inspection device is arranged and configured to inspect a second surface of the packages which is opposite from the first surface while they are being held by the offloading device.

11 Claims, 10 Drawing Sheets

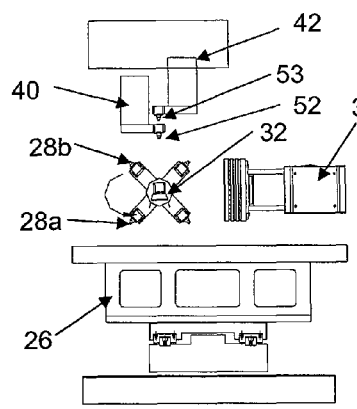
FIG. 4A
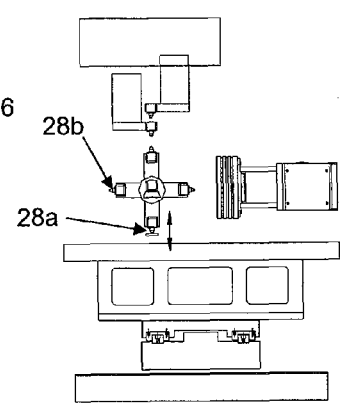
FIG. 4B
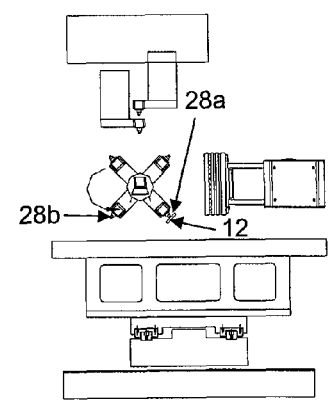
FIG. 4C
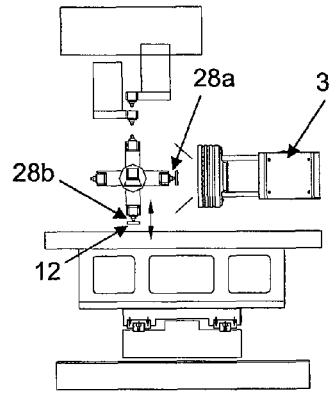
FIG. 4D
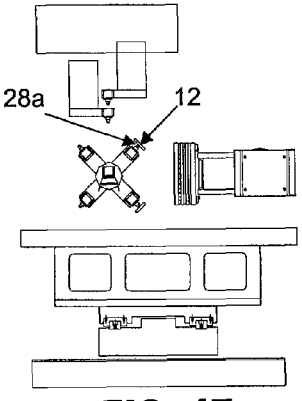
FIG. 4E
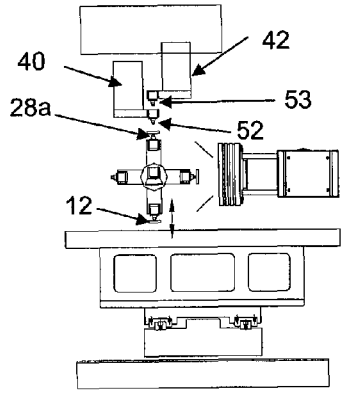
FIG. 4F
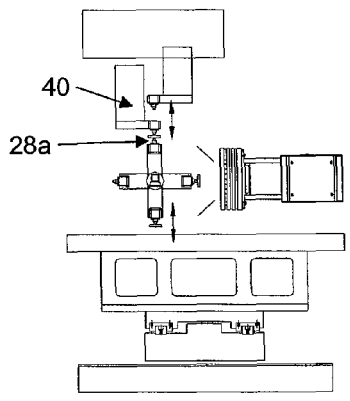
FIG. 4G
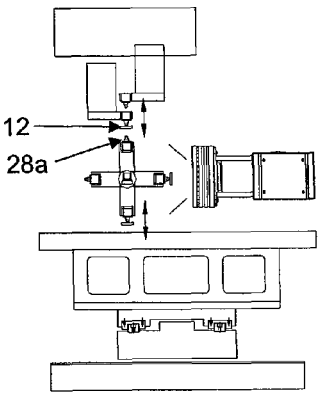
FIG. 4H
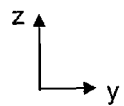

HANDLING SYSTEM FOR INSPECTING AND SORTING ELECTRONIC COMPONENTS

FIELD OF THE INVENTION

The present invention relates to apparatus and methods for processing electronic components such as semiconductor packages, and in particular, to the singulation, inspection, sorting and offloading of the electronic components.

BACKGROUND AND PRIOR ART

The sorting of electronic components, such as packages that have been singulated on a mounting tape or a singulation jig, is one of the key back-end processes for the manufacture of electronic packages like Ball Grid Array ("BGA") packages, Quad Flat No leads ("QFN") packages and Chip-Scale Packages ("CSP").

In a CSP package, there is a lead or ball side (top surface) for making electrical connections with other devices, as well as a mold side (bottom surface) comprising an encapsulant for protecting the internal circuitry. The mold side is also commonly referred to as a marking side as labels or other information may be marked onto this surface of the package. Inspection results on the lead/ball side and mold/marking side are commonly used as sorting criteria when sorting different packages that have been formed to determine whether packages have been satisfactorily assembled. Accordingly, an important performance index for a machine used for processing semiconductor packages is its inspection and sorting throughput.

Typically, after sorting and inspecting, good packages are offloaded to a container, such as a tray or tube container, and rejected packages are disposed of in a reject bin. Further, reworked units may be transferred to yet another tray or bin.

A method to pick-up and sort singulated electronic packages is illustrated in U.S. Pat. No. 7,190,446 entitled "System for Processing Electronic Devices". Singulated packages are individually picked up from a tape and placed onto holders at a certain segment of a rotary table. Concurrently, inspections of the packages take place at other segments of the rotary table. The packages are next rotated to a segment to be picked up by an offloading arm which transfers the packages to different offloading devices such as a tube, tray or bin, according to the inspection results. There is, however, a shortcoming in this prior art apparatus in that inspection of the mold side of the package is done through the glass holder, which may render inspection results unreliable as a result of the quality of the glass and contamination through use. Further, no flipping feature is provided in order to expose the mold side for inspection.

Another pick-up and sorting apparatus is disclosed in U.S. Pat. No. 6,446,354 entitled "Handler System for Cutting a Semiconductor Package Device". The singulated packages are picked up by a vacuum head, washed with water and dried while being held by the vacuum head. After cleaning and drying, the packages are placed onto a hot plate having an array of small vacuum holes for further drying and lead/ball surface inspection. Half of the packages are placed onto a turntable with a buffer plate on top, with pockets arranged in an alternating format. The remaining packages are put onto the second half of the buffer plate. The buffer plate rotates when required to position the packages in a preferred orientation before being picked up by dual offloading pick arms. The packages are then picked up separately by multiple vacuum heads on the dual offloading pick arms which transfer the packages to a position opposite the offloading device for mark inspection. The packages are further transferred to a tray or a tube according to the inspection results.

This method is undesirable in that a complicated buffer plate with guiding walls in each pocket are required in order to accommodate the packages. Therefore, more expensive fabrication methods are required. There is also a possibility that the singulated packages do not fit securely into the pockets of the buffer plate. While it is essential for sufficient clearance between the walls and the packages to achieve an accurate placement of the packages into the pockets of a tray or insertion into a tube, the clearance cannot be too small resulting in unstable packages positioning on the buffer plates. This problem of having to provide sufficient clearance is especially obvious when handling smaller packages (e.g. 2×2 mm and 3×3 mm).

In yet another prior art approach, U.S. Pat. No. 6,655,045 entitled "Apparatus and Method for Pick and Place Handling" discloses a gang transfer arm which carries the singulated packages by a gang "sliding" approach. The singulated packages are slid by a rinsing carrier from a singulation jig to a rinsing platform. Next, a drying carrier moves the washed packages further for drying on the same platform. The packages are moved in individual rows onto a transfer track where the packages are separated into separate units for picking up at the end of the track. Lead/ball surface inspection is conducted before offloading units to either a tray, tube, reject bin, or canister according to the inspection results. As different conversion kits are required for different packages, this method involves high costs. The setup and conversion are also difficult, requiring major leveling adjustments from singulation jig to the rinsing platform, a map separator and the transfer track. Additionally, this method limits inspection to the lead/ball surface of the packages only.

Therefore, in the light of the disadvantages in the prior art as described above, it would be desirable to provide simple and reliable apparatus and methods for handling singulated packages which allow full inspection of multiple sides of the packages (such as the bottom and top surfaces and the remaining four sides), and which are efficient and cost effective.

SUMMARY OF THE INVENTION

It is thus an object of the invention to seek to provide a handling system for efficient sorting and offloading of singulated electronic components, which also provides reliable inspection of multiple surfaces of the electronic components and simpler handling requirements as compared to the prior art.

Accordingly, the invention provides a semiconductor package handling system comprising: a package holder for receiving and holding singulated semiconductor packages; a first inspection device arranged and configured to inspect a first surface of the packages while they are being held by the package holder; an offloading device for receiving the packages from the package holder and to convey the packages to an offloader; and a second inspection device arranged and configured to inspect a second surface of the packages which is opposite from the first surface while they are being held by the offloading device.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of a preferred embodiment of the invention when considered with the accompanying drawings, in which:

FIGS. 4A to 4H illustrate side views (in the y-z axes) of a working sequence of the rotary pick arms of the apparatus of FIG. 3;

DETAILED DESCRIPTION OF THE PREFERRED EMBODIMENTS OF THE INVENTION

The preferred embodiments of the present invention will be described hereinafter with reference to the accompanying drawings.

Figure 1:
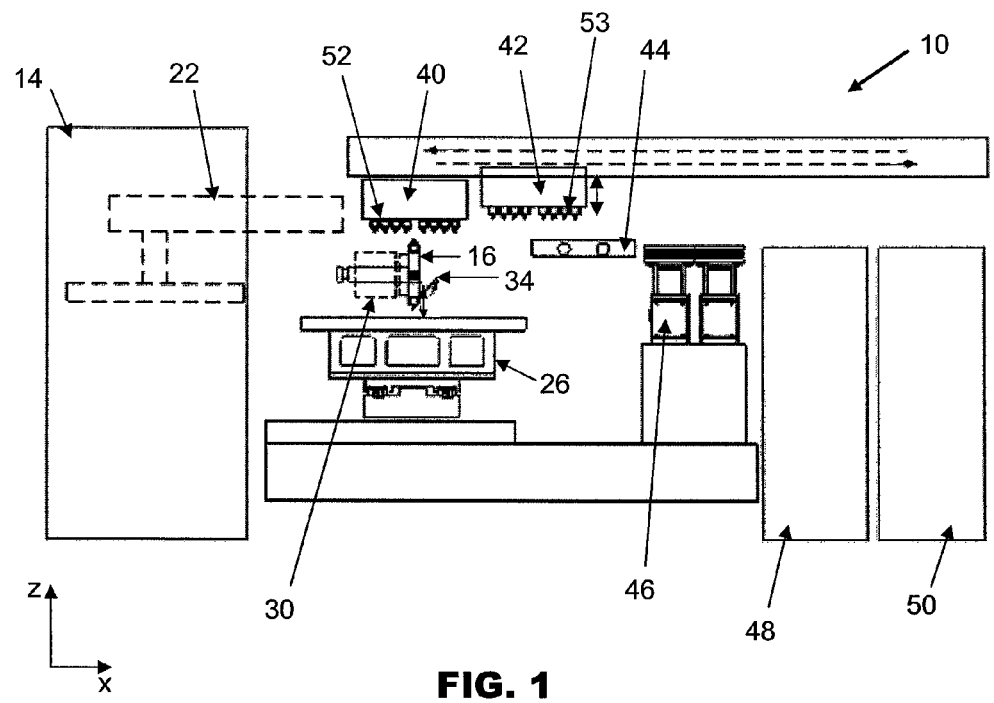
FIG. 1 is a side view (in the x-z axes) of an inspection apparatus for sorting, inspecting and offloading singulated packages on a mounting tape according to the first preferred embodiment of the invention.
Figure 2:
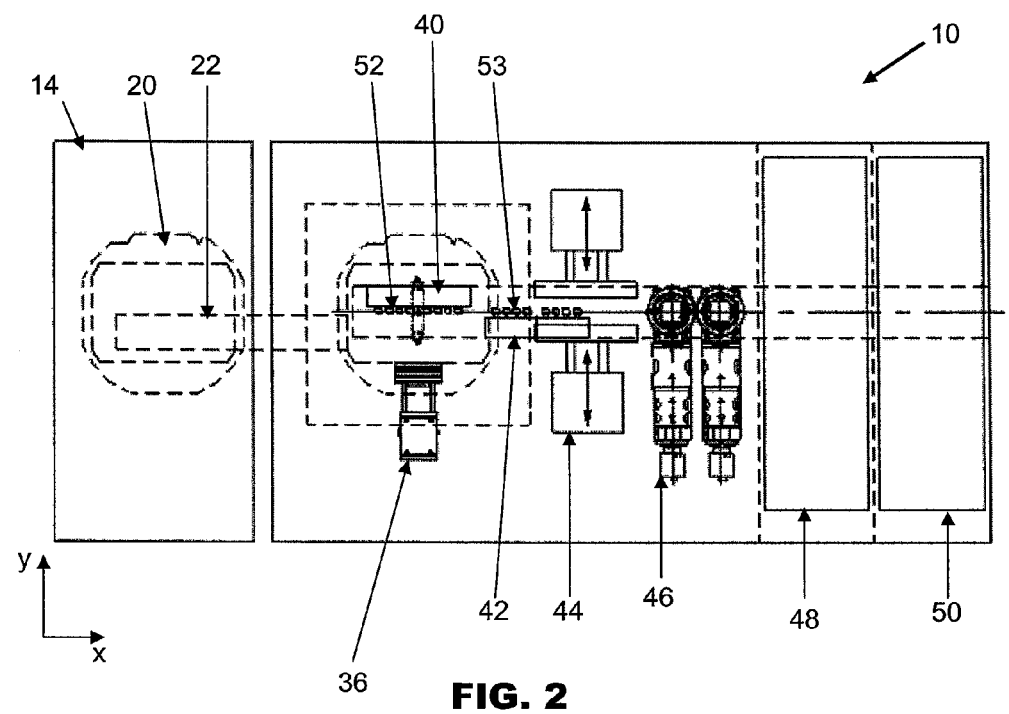
FIG. 2 is a plan view (in the x-y axes) of the inspection apparatus of FIG. 1.

FIG. 1 is a side view (in the x-z axes) of an inspection apparatus 10 for sorting, inspecting and offloading singulated packages 12 on a mounting tape according to the first preferred embodiment of the invention. FIG. 2 is a plan view (in the x-y axes) of the inspection apparatus 10 of FIG. 1.

The inspection apparatus 10 can be generally divided into two modules, namely a tape handling and packages pick-up module and a package offload module. The tape handling and packages pick-up module includes a loading/unloading station 14 and a pick-up station comprising a package holder for receiving and holding singulated packages. The package holder may be in the form of quadruple rotary pick arms 16. There is also a first inspection device arranged and configured to inspect a first surface of the packages while they are being held by the package holder. The package offload module includes an offloading device, such as dual linear offloading arms 40, 42, a gang précising station with a gang précisor 44, a second inspection device such as a ball inspection device 46 and offloaders 48, 50. The second inspection device is arranged and configured to inspect a second surface of the packages which is opposite from the first surface while they are being held by the offloading device.

The loading/unloading station 14 comprises a wafer ring onloader 20 with a ring loading/unloading arm 22. The ring loading/unloading arm 22 transfers a wafer ring holding packages on an adhesive mounting tape from the loading/unloading station 14 to the wafer table 26. After the packages have been picked up from the tape by the rotary pick arms 16, the wafer ring is removed by the ring loading/unloading arm 22 from the wafer table 26 back to the loading/unloading station 14.

The quadruple rotary pick arms 16 are vertically arranged and are located above the wafer table 26. They comprise four rotary pick heads 28 which are preferably equally spaced from one another, i.e. by angles of 90°. The quadruple rotary pick arms 16 are driven by a motor 30 which is preferably a direct drive motor with a hollow shaft at its center and which rotates about the x-axis. Therefore, the four pick heads 28 of the quadruple rotary pick arms 16 rotate along a vertical plane extending along the y-z direction. A lighting source 34 located next to the quadruple rotary pick arms 16 provides illumination of the packages on the tape.

The linear offloading arms 40, 42 are positioned above the wafer table 26 and each arm moves independently to and from the gang précisor 44 and the offloaders 48, 50 in the x-direction. The linear offloading arms 40, 42 comprise two linearly movable arms with each offloading arm having multiple offloading pick heads 52, 53 which are arranged in a single row and aligned along a straight center line. The center lines of both arms 40, 42 are thus preferably aligned with each other such that the pick and place points of the multiple offloading pick heads 52, 53 lie along the same center line. Additionally, the offloading pick heads 52, 53 are preferably arranged facing each other.

The multiple offloading pick heads 52, 53 optimize the cycle time for picking and placing packages. For BGA packages, vertical motion is not necessary during ball inspection. Therefore, four to six heads per arm is preferred since less inspection time is needed in the absence of vertical motion during inspection. The ball inspection device 46 is located underneath the paths of the linear offloading arms 40, 42 and upstream of the loading devices.

The gang précisor 44 is located between the quadruple rotary pick arms 16 and the ball inspection device 46. The gang précisor 44 comprises a pair of parallel bars located at about the same level as the packages picked by the linear offloading arms 40, 42. When the linear offloading arms 40, 42 pick up the packages and travel next to the gang précisor 44, the gang précisor 44 closes to align all the packages held by the offloading arm 40, 42 simultaneously. This saves processing time by ensuring consistency in the angular and positional orientation of all the packages. Alternatively, if there is a space constraint, the gang précisor 44 may be located above the quadruple rotary pick arms 16 such that the précising action is done immediately after all packages are picked up on one arm. Another possibility is to position the gang précisor 44 above the ball inspection device 46. After précising, the packages are transported to the ball inspection device 46 for ball inspection.

In FIG. 2, the first inspection device in the form of a mold surface inspection device 36 is shown pointing to the back of the apparatus. The gang précisor 44 moves in the y-direction and opens to receive one of the linear offloading arms 40, 42 carrying packages on the multiple offloading pick heads 52, 53. It closes to align the packages simultaneously for angular and positional consistency of the packages.

After précising and inspecting the balls of the packages, the positions of the packages on the linear offloading arms 40, 42 are recognized and are placed onto the offloaders 48, 50.

Accurate positioning of the packages is further facilitated with appropriate x and y positional compensation where x compensation may be provided by the linear offloading arms 40, 42 and y compensation may be provided by the offloaders 48, 50. Angular compensation is not necessary as the packages have already been oriented by the gang précisor 44.

Figure 3:
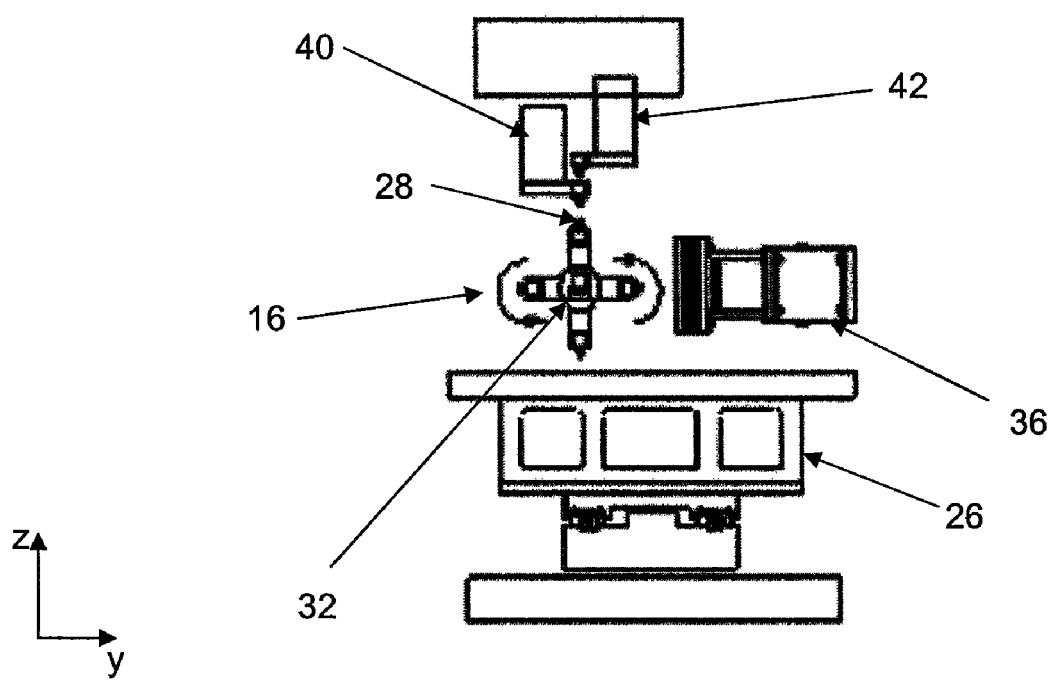
FIG. 3 is a side view (in the y-z axes) of the rotary pick arms of the inspection apparatus of FIG. 1.

FIG. 3 is a side view (in the y-z axes) of the rotary pick arms 16 of the inspection apparatus 10 of FIG. 1. Four pick heads 28 comprised in the quadruple rotary pick arms 16 are rotatable on the vertical y-z plane. Additionally, a pattern recognition ("PR") alignment optical system 32 is preferably positioned inside the hollow shaft of the motor 30. The PR alignment optical system 32 recognises the position of each package to be picked and its alignment relative to the rotary pick heads 28 so that the wafer table 26 is able to carry out positional compensation in the x, y and θ directions for precisely picking up the package.

At the pick-up station, packages are picked up individually from the mounting tape consecutively by the four pick heads 28 using vacuum suction. Next, the picked package is subject to mold surface inspection by the mold surface inspection camera 36 located horizontally next to it along the y-direction. The mold surface inspection camera 36 may point either to the back or to the front of the inspection apparatus 10, depending on the rotational direction of the quadruple rotary pick arms 16. Thereafter, the picked package is picked up by one of the multiple offloading pick heads 52, 53 on the dual linear offloading arms 40, 42 using vacuum suction for downstream inspection and offload processes.

FIGS. 4A to 4H illustrate side views (in the y-z axes) of a working sequence of the rotary pick arms 16 of the apparatus of FIG. 3. In FIG. 4A, the quadruple rotary pick arms 16 rotate unidirectionally such that a first pick head 28a moves by 45° towards the mold surface inspection device 36. The PR alignment optical path is not blocked in this position by any one of the pick heads 28, so it is able to view the position and orientation of a first package 12 to be picked up. Alternatively, instead of stopping at the 45° orientation, the quadruple rotary pick arms 16 may rotate within an angular range of between, for example 30° to 60°, as long as the optical path is not blocked by any two adjacent pick heads 28 and the package 12 is viewable between the adjacent rotary pick heads 28. On-the-fly PR alignment is achievable in this way and is useful when cycle time is critical.

In FIG. 4B, after PR alignment of a package 12 and the corresponding package position compensation by the wafer table 26 has been conducted, the quadruple rotary pick arms 16 are rotated until a pick head 28 is over a first package 12 and picks up the first package 12 by vacuum suction. At this position, the view of the package by the PR alignment optical system 32 is blocked. The quadruple rotary pick arms 16 are then rotated another 45° such that in FIG. 4C, the PR alignment optical path is unblocked by the first pick head 28a to allow pattern recognition of a second package 12 to be picked up.

The quadruple rotary pick arms 16 rotate another 45° in FIG. 4D such that a second pick head 28b is over the second package 12 and is lowered to pick up the package. At the same time, the first package 12 is held by the first pick head 28a at a position 90° from the pick-up position. In this position, the mold surface of the first package 12 faces the mold surface inspection camera 36 for inspection. Therefore, the mold surface of the first package 12 can be inspected by the mold surface inspection camera 36 almost at the same time as when the second package 12 is being picked up. As a result, cycle time is reduced.

In FIG. 4E, the quadruple rotary pick arms 16 rotate a further 45° and PR alignment optical system 32 recognizes the position of a third package 12 on the wafer table 26. In FIG. 4F, the second package 12 on the pick head 28b has its mold surface inspected by the mold surface inspection camera 36 while the third package 12 is picked up. At the same time, the first package 12 is now positioned at an upright orientation pointing upwards towards the multiple offloading pick heads 52 of the linear offloading arm 40.

In FIG. 4G, an offloading pick head 52 of the linear offloading arm 40 moves down to pick and receive the first package 12 from the first rotary pick head 28a while mold surface inspection of the second package 12 held on another rotary pick head 28b is conducted. In FIG. 4H, the offloading pick head 52 is raised together with the first picked package 12.

The pick-up and mold inspection cycles are repeated as shown in FIGS. 4F to 4H until all the packages 12 on the mounting tape held on the wafer ring are picked up and their mold surfaces are inspected. A new wafer ring is loaded to the wafer table 26 and the steps from FIGS. 4A to 4H are repeated.

FIGS. 5A to 5F illustrate side views (in the x-z axes) of a working sequence during the transfer of packages 12 between the rotary pick arms 16 and linear offloading arms 40, 42 and the offloading process between the linear offloading arms 40, 42 and the offloaders 48, 50 of the inspection apparatus of FIG. 1.

Figure 5A:
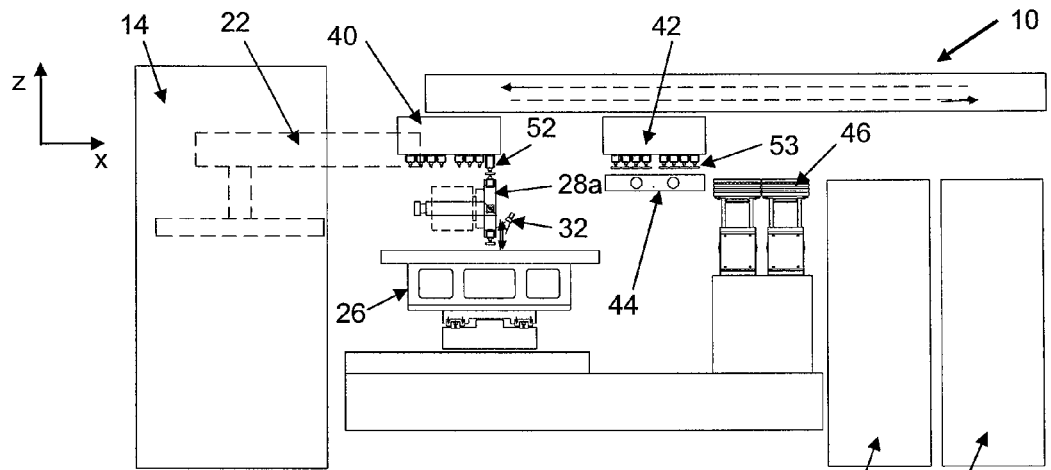
FIGS. 5A to 5F illustrate side views (in the x-z axes) of a working sequence during the transfer of packages between the rotary pick arms and linear offloading arms and the offloading process between the linear offloading arms and the offloaders of the inspection apparatus of FIG. 1.

In FIG. 5A, the first linear offloading arm 40 moves directly over the quadruple rotary pick arms 16 to position the multiple offloading pick heads 52 of the offloading arm 40 over the rotary pick arms 16. A first offloading pick head 52 is lowered from the linear offloading arm 40 to pick up a first package 12 from the rotary pick head 28a. At the same time, the second linear offloading arm 42 with multiple offloading pick heads 53 holding one package 12 each moves to the gang précisor 44 for package orientation alignment. All the packages 12 held by the offloading pick heads 53 are then aligned simultaneously by the gang précisor 44.

Figure 5B:
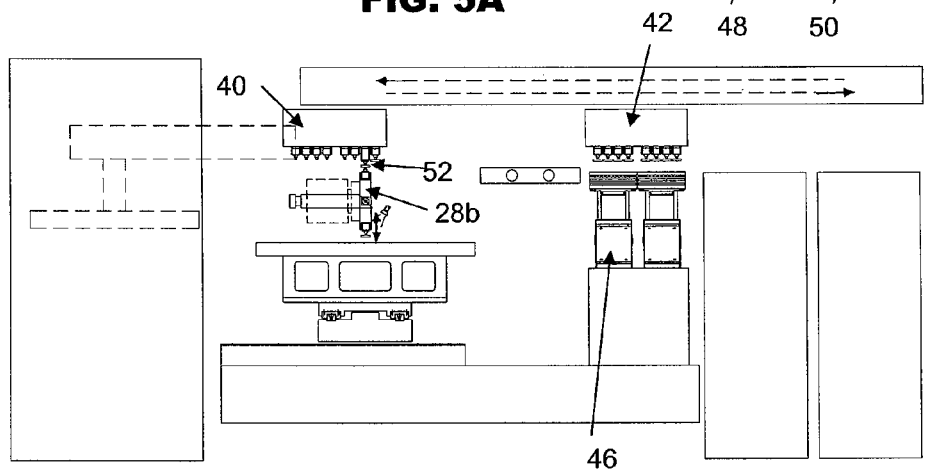

In FIG. 5B, a second offloading pick head 52 is lowered to pick up the next package 12 from the rotary pick head 28b of the quadruple rotary pick arms 16. At the same time, the second linear offloading arm 42 completes the précising process at the gang précising station. The second linear offloading arm 42 moves to the ball inspection device 46 for ball inspection of the BGA packages.

Figure 5C:
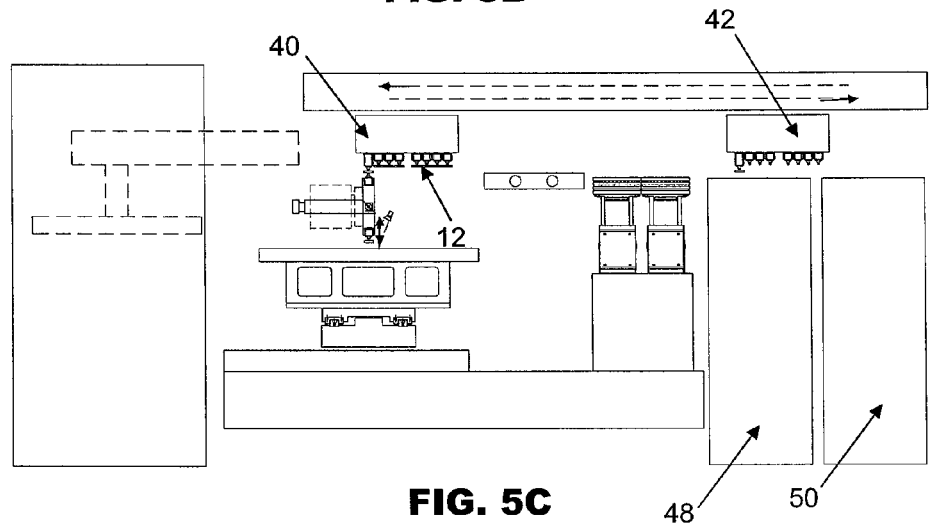

At the quadruple rotary pick arms 16, the pick-up cycle is repeated by the first linear offloading arm 40 until the last offloading pick head 52 picks up a package 12 as shown in FIG. 5C. The second linear offloading arm 42 has completed the ball inspection of the packages 12 on the arm 42 and then moves to the offloaders 48, 50 for offloading the packages 12 held by it. During offloading, the packages 12 are sorted according to the inspection results into different offloaders 48, 50.

Figure 5D:
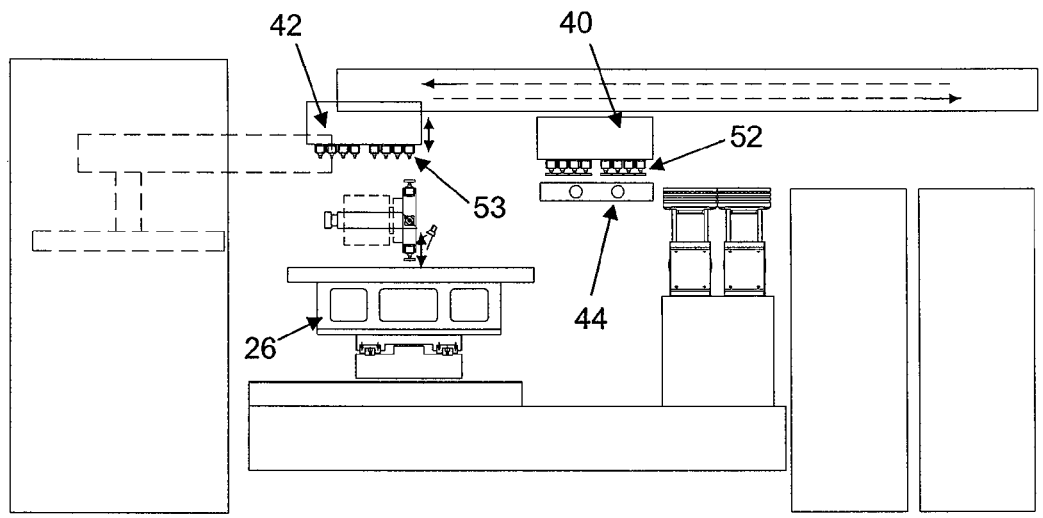

In FIG. 5D, after offloading all the packages 12, the second linear offloading arm 42 moves to the quadruple rotary pick arms 16 to pick up packages 12 while the first linear offloading arm 40 with a full load of the packages 12 held by its pick heads 52 moves to the gang précisor 44 for package orientation alignment. The packages 12 are aligned simultaneously by the gang précisor 44.

Figure 5E:
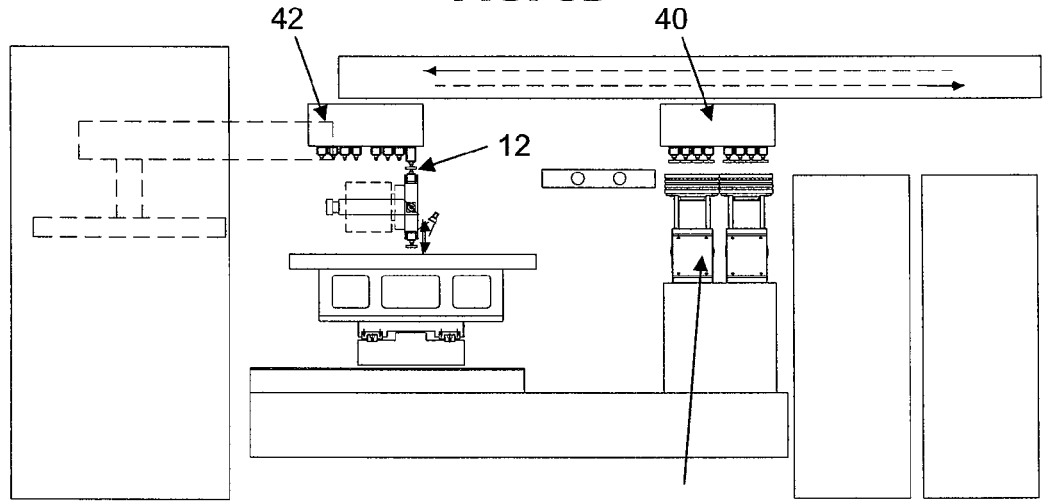

In FIG. 5E, the second linear offloading arm 42 continues to pick up packages 12 from the quadruple rotary pick arms 16 while the first linear offloading arm 40 moves to the ball inspection device 46 for inspection of the BGA packages held by it.

Figure 5F:
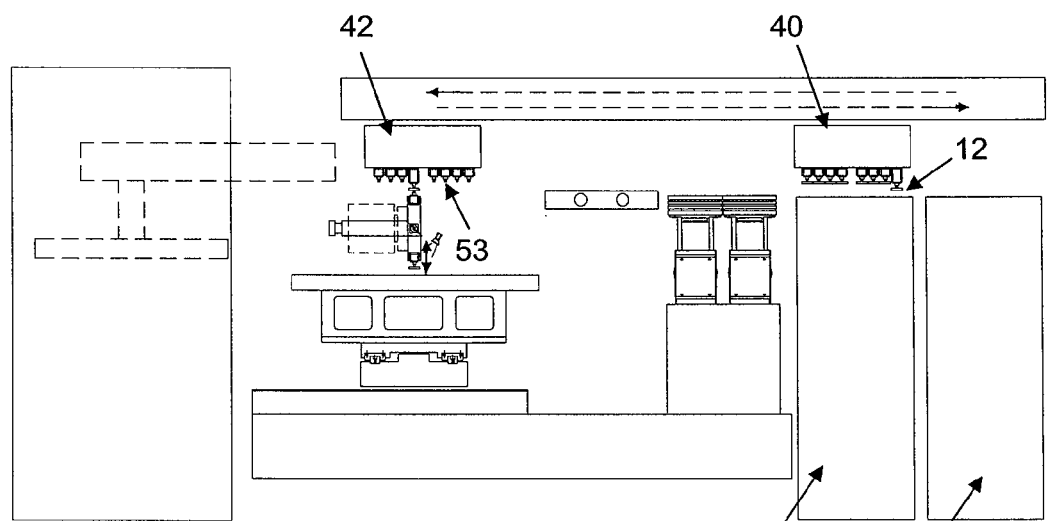

The pick-up cycle is repeated as shown in FIG. 5F until the last offloading pick head 53 of the second linear offloading arm 42 picks up a package 12. The first linear offloading arm 40 has completed the ball inspection of the packages 12 on the arm 40 and moves to the offloaders 48, 50 for offloading the picked packages according to the inspection results. The steps described in FIGS. 5A to 5F are repeated until all the packages 12 are sorted and offloaded.

FIGS. 6A-6D are side views of a five-sides inspection device 46' which is usable with the preferred embodiment of the invention for inspecting QFN packages 12 and which illustrate a working sequence for inspecting QFN packages 12 on the offloading arms 40, 42.

For QFN packages, vertical motion is needed for additionally inspecting the leads on the four side walls of the QFN packages. A longer inspection time is required to project the packages towards the inspection optical systems by independently projecting each offloading pick head relative to the other offloading pick heads 52, 53. In order to increase throughput, eight to ten heads are arranged in two separate groups such as in 2×4 or 2×5 configurations to match the arrangement of the dual five-sides inspection device 46' in the inspection apparatus 10 which have replaced the ball inspection device 46 of FIG. 1. The pitch between the respective offloading pick heads comprised in the two groups of offloading pick heads 52, 53 on each linear arm 40, 42 preferably matches the pitch between the centers of the dual five-sides inspection optical systems 54 in the five-sides inspection device 46' such that simultaneous inspection of the packages on the two groups of the offloading pick heads 52, 53 of one arm can take place in a shorter cycle time. However, a single five-sides inspection device with one five-sides inspection optical system is sufficient if cycle time is not a concern. The quantity of pick heads per group to be used depends on the requirements of the apparatus cycle time. To achieve a shorter cycle time, more pick heads per group is preferable.

Figures 6A, 6B, 6C, 6D:
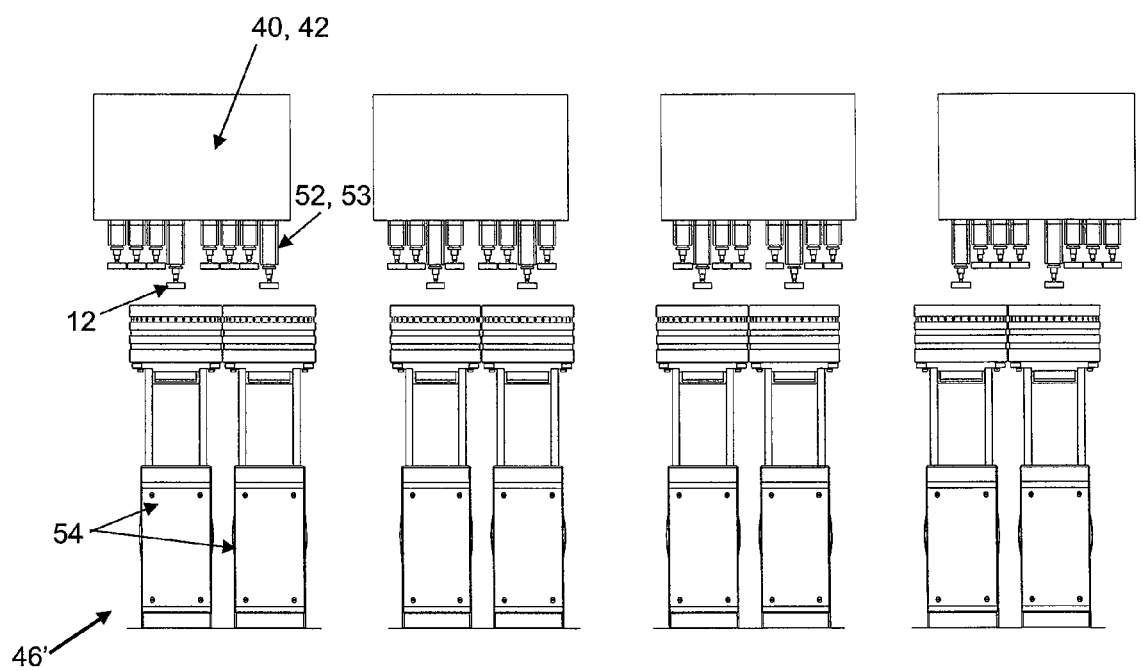
FIGS. 6A-6D are side views of a five-sides inspection device which is usable with the preferred embodiment of the invention for inspecting QFN packages and which illustrate a working sequence for inspecting QFN packages held on the offloading arms.

The five-sides inspection working sequence is shown in FIGS. 6A to 6D. In FIG. 6A, the first pick heads of each group of offloading pick heads of the linear offloading arm 40, 42 are lowered simultaneously to the corresponding optical system 54 for five-sides inspection of the two packages 12 held by the respective pick heads of the offloading arm 40, 42.

In FIG. 6B, after completing the five-sides inspection of the first two packages 12 held by the first two pick heads of the two offloading arms 40, 42, the second pick heads of each group are lowered simultaneously towards the corresponding optical systems 54 for five-sides inspection of the two packages 12.

In FIG. 6C, the third pick heads of the offloading arm 40, 42 proceed likewise as with the first and second pairs of pick heads illustrated in FIGS. 6A and 6B. This is repeated till the last pair of pick heads complete the five-sides inspection process as shown in FIG. 6D.

Figure 7:
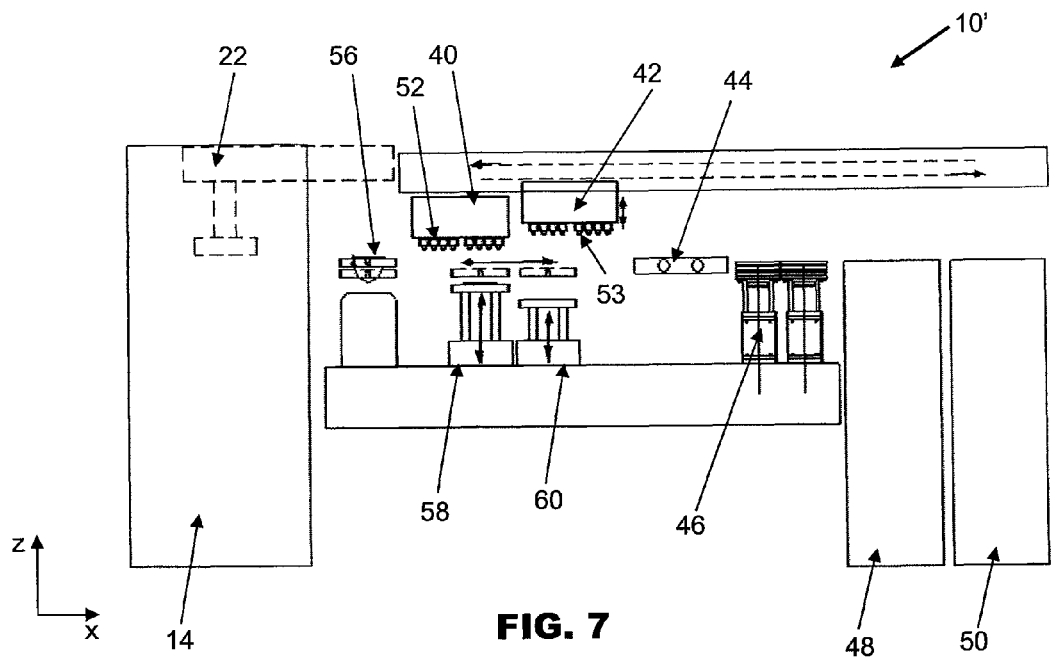
FIG. 7 is a side view (in the x-z axes) of an inspection apparatus for sorting, inspecting and offloading singulated packages according to a second preferred embodiment of the invention for singulation jigs.
Figure 8:
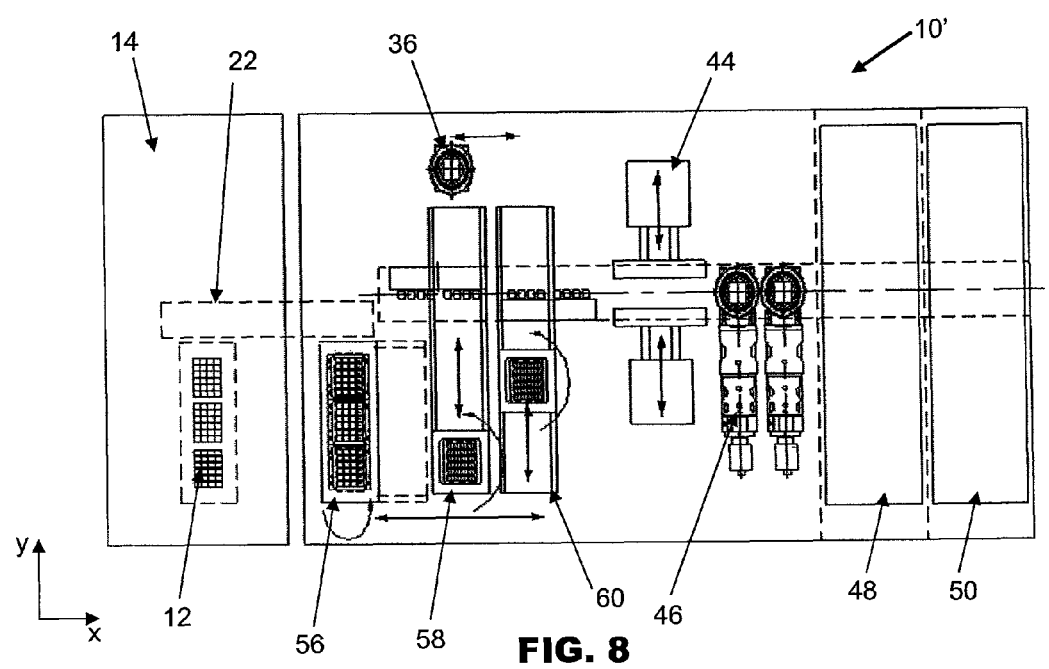
FIG. 8 is a plan view (in the x-y axes) of the inspection apparatus of FIG. 7.

FIG. 7 is a side view (in the x-z axes) of the inspection apparatus 10' for sorting, inspecting and offloading singulated packages 12 according to a second preferred embodiment of the invention for singulation jigs. FIG. 8 is a plan view (in the x-y axes) of the inspection apparatus 10' of FIG. 7. In this embodiment, the packages 12 are singulated on a singulation jig instead of on a mounting tape.

The inspection apparatus 10' includes two main modules, namely the onload and front processes module and a package offload module. The onload and front processes module includes an unloading arm 22, a flipping platform 56 and package holders in the form of dual buffer boats 58, 60, each of which is configured to hold an array of packages. A first inspection station in the form of a molding inspection device 36 is also present. The package offload module is the same as that described above in the first embodiment of the invention which comprises dual linear offloading arms 40, 42, a gang précisor 44, a second inspection device such as a ball inspection device 46 and offloaders 48, 50.

The unloading arm 22 picks up all the singulated packages 12 from the singulation jig and loads them onto the flipping platform 56 with their mold sides facing downwards. The flipping platform 56 flips the packages 12 received by 180° so that their mold sides or surfaces point upwards for inspection by the first inspection device. It then moves in the x-direction to transfer the packages block by block onto one of the dual buffer boats 58, 60 when the buffer boat 58, 60 is raised. After the buffer boats 58, 60 receive the packages 12, they transport the packages 12 with their mold surfaces pointing upwards in the y-direction to the mold inspection device 36 at the back of the inspection apparatus 10' for mold surface inspection.

After mold surface inspection, the buffer boats 58, 60 move to the middle of the inspection apparatus 10' where the linear offloading arms 40, 42 are positioned for the multiple offloading pick heads 52, 53 to pick up the packages 12. The offloading arm 40 holding the packages 12 then moves to the gang précisor 44 for alignment to maintain angular consistency of the packages 12. Next, the packages 12 are transported by the linear offloading arm 40 to the ball inspection device 46 for inspection of BGA packages, before the packages 12 are offloaded to the offloaders 48, 50.

The mold surface inspection device 36 is located at the back of the inspection apparatus 10' in the illustrated embodiment for inspecting the packages 12 which have been transported to the back of the apparatus 10' on one of the buffer boats 58, 60. The mold inspection device 36 is movable in the x-direction to inspect packages 12 held on one of the buffer boats 58, 60. Preferably, the buffer boats 58, 60 can rotate 90°, 180° or 270° from the original orientation to suitably orientate the packages 12 for downstream processes.

FIGS. 9A to 9H illustrate side views (in the x-z axes) of a working sequence of the transfer of BGA packages 12 from the flipping platform 56 to the buffer boats 58, 60 followed by the linear offloading arms 40, 42 and of the offloading process between the linear offloading arms 40, 42 and the offloaders 48, 50 of the inspection apparatus 10' of FIG. 7.

Figure 9A:
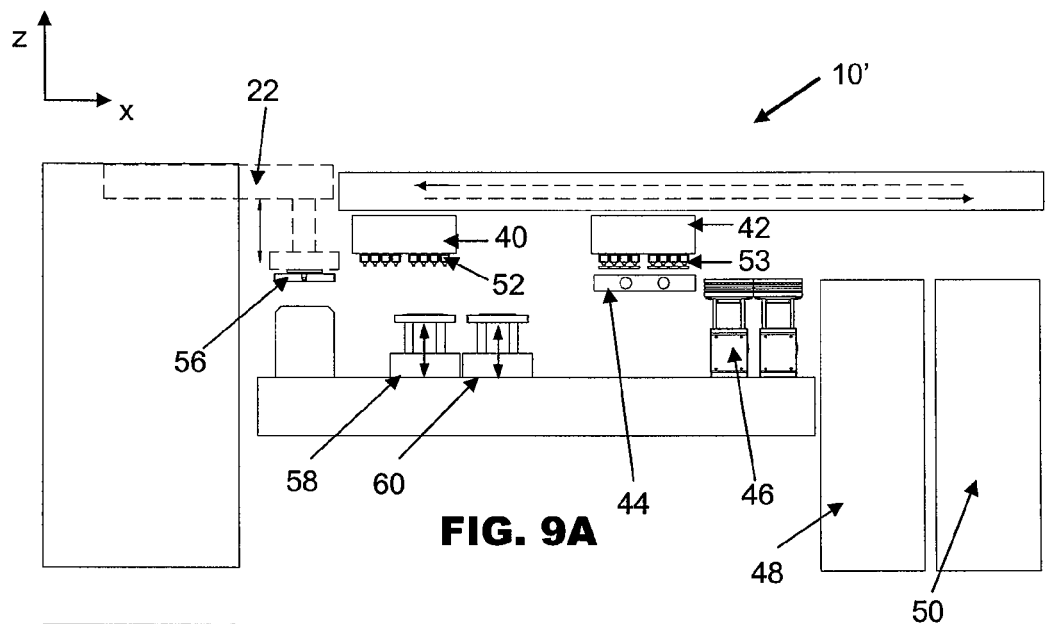
FIGS. 9A to 9H illustrate side views (in the x-z axes) of a working sequence of the transfer of packages from a flipping platform to linear offloading arms and of the offloading process between the linear offloading arms and the offloaders of the inspection apparatus of FIG. 7.

In FIG. 9A, the unloading arm 22 has transferred the packages 12 from a singulation jig to the flipping platform 56. At the same time, the first linear offloading arm 40 stands by above one of the dual buffer boats 58, 60 to pick up packages 12 after mold surface inspection. The second linear offloading arm 42 carrying packages 12 after inspection is at the gang précisor 44 for package orientation alignment as described in the first embodiment.

Figure 9B:
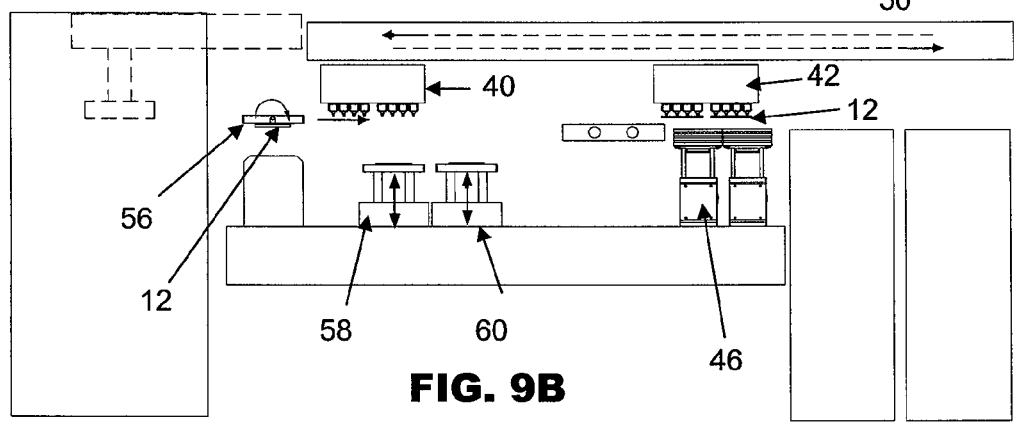
Figure 9C:
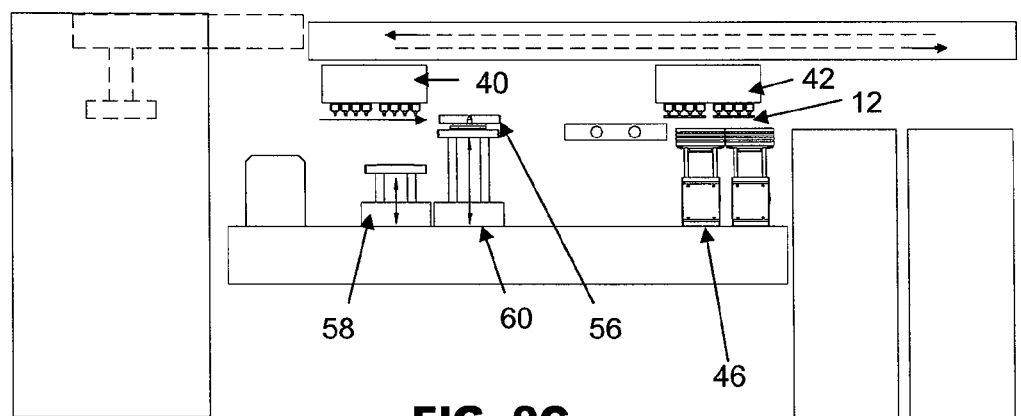

FIG. 9B shows the flipping platform 56 flipping the packages 12 by 180° before moving to one of the dual buffer boats 58, 60 in the x-direction. The second offloading arm 42 moves the packages 12 held by it to the ball inspection device 46 for inspection of the BGA packages. FIG. 9C shows that, substantially concurrently, the second buffer boat 60 moves up to receive a block of packages 12 from the flipping platform 56. The second buffer boat 60 rotates, if necessary, to the required orientation of the packages 12 for downstream processes before moving to the mold surface inspection device 36 at the back of the inspection apparatus 10' for mold surface inspection.

Figure 9D:
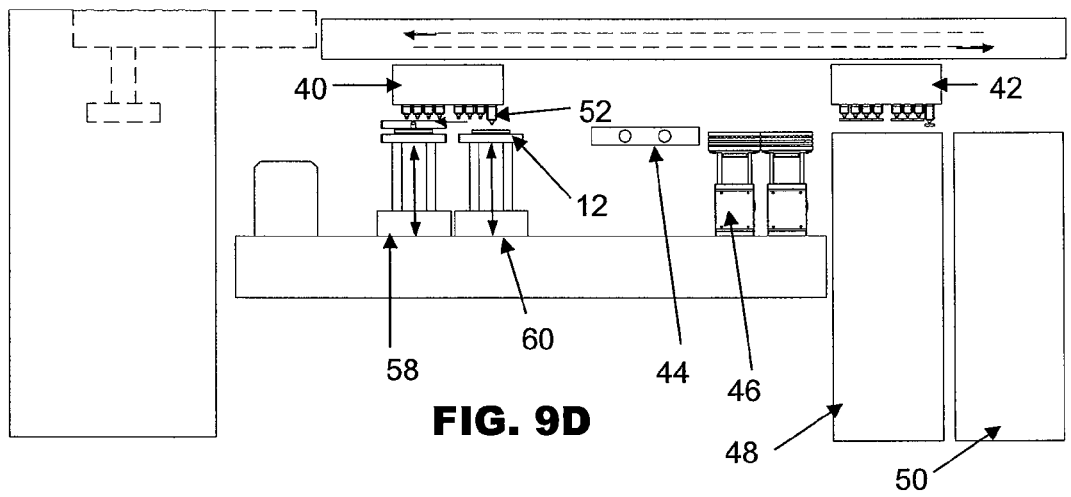

In FIG. 9D, after mold surface inspection, the second buffer boat 60 moves to the middle of the inspection apparatus 10' such that the first offloading arm 40 may pick up the inspected packages 12 individually with its pick heads 52. The second buffer boat 60 indexes in the y-direction so that the packages 12 are picked up one row at a time by the offloading arm 40 until all the offloading pick heads 52 have picked up one package 12 each from the buffer boat 60. At the same time, the second offloading arm 42 moves to the offloaders 48, 50 for offloading the picked packages 12 after ball inspection of the packages 12 has been completed. It can also be noted in this figure that the first buffer boat 58 receives a block of packages 12 from the flipping platform 56.

Figure 9E:
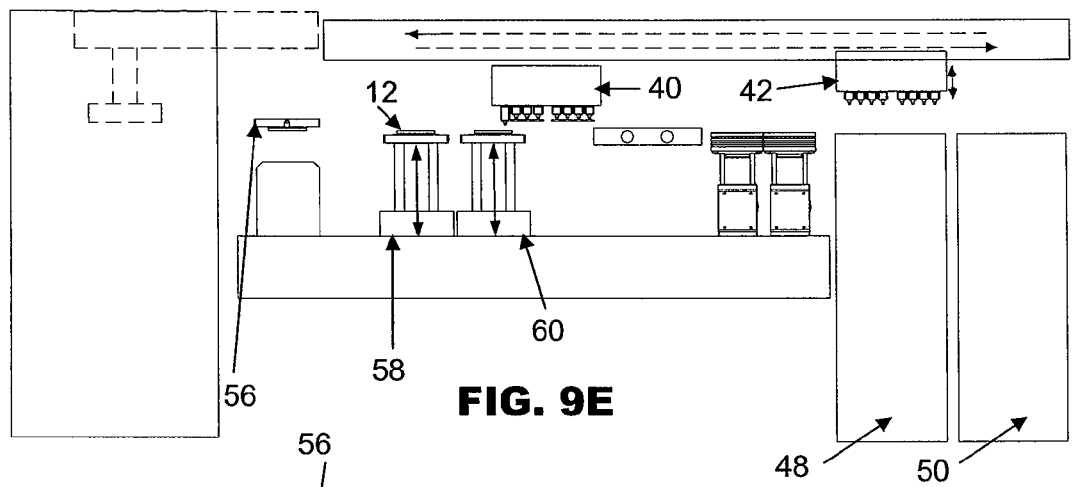

In FIG. 9E, the last offloading pick head 52 on the first offloading arm 40 picks up a package 12 while offloading is completed at the second offloading arm 42. At this time, the first buffer boat 58 has already received a block of packages 12 from the flipping platform 56 and moves to the back of the apparatus 10' for mold surface inspection.

Figure 9F:
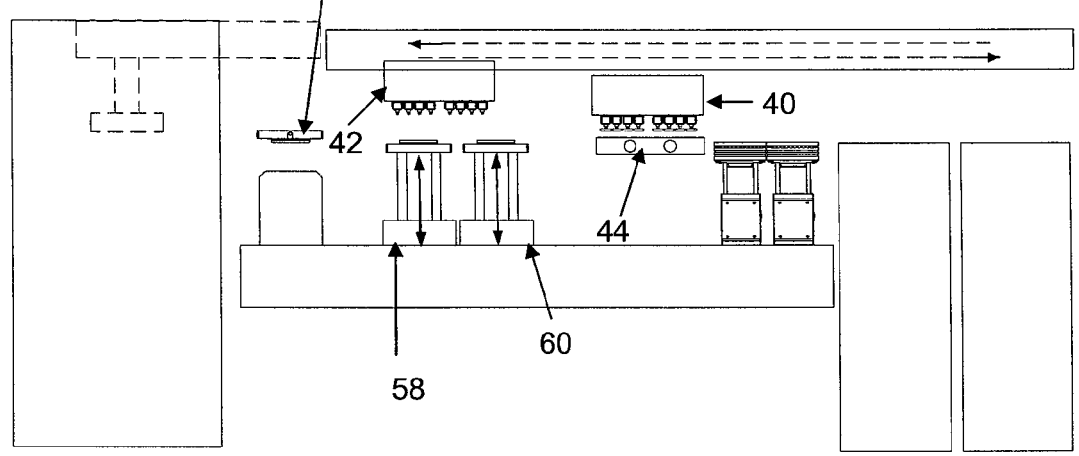
Figure 9G:
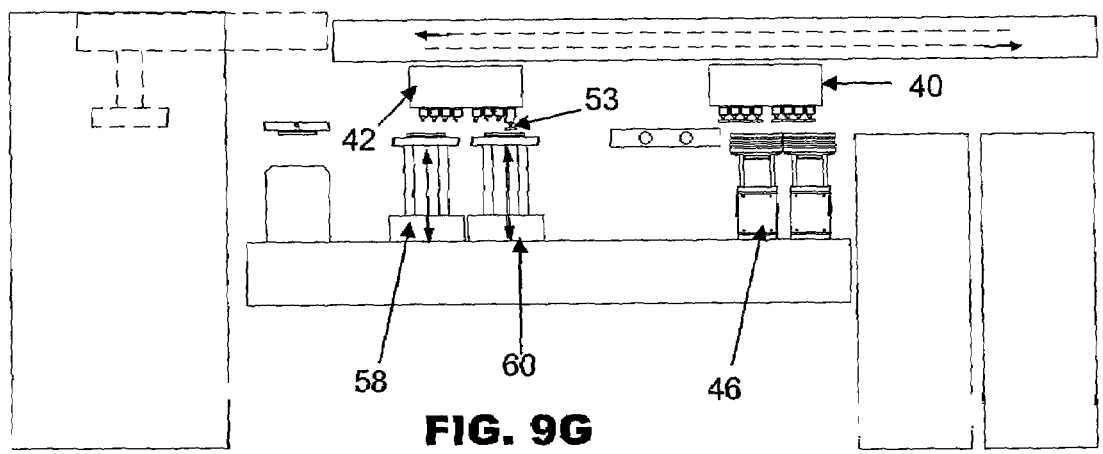

In FIG. 9F, the first buffer boat 58 moves to the middle of the apparatus 10' after mold surface inspection for the packages 12 to be picked by the offloading pick heads 53 of the second offloading arm 42. The first offloading arm 40 is at the gang précisor for package orientation alignment. In FIG. 9G, the second offloading arm 42 picks up packages 12 from the second buffer boat 60 in the same manner as described above with respect to the first offloading arm 40. The first offloading arm 40 moves the packages 12 to the ball inspection device 46 for ball inspection of the packages 12.

Figure 9H:
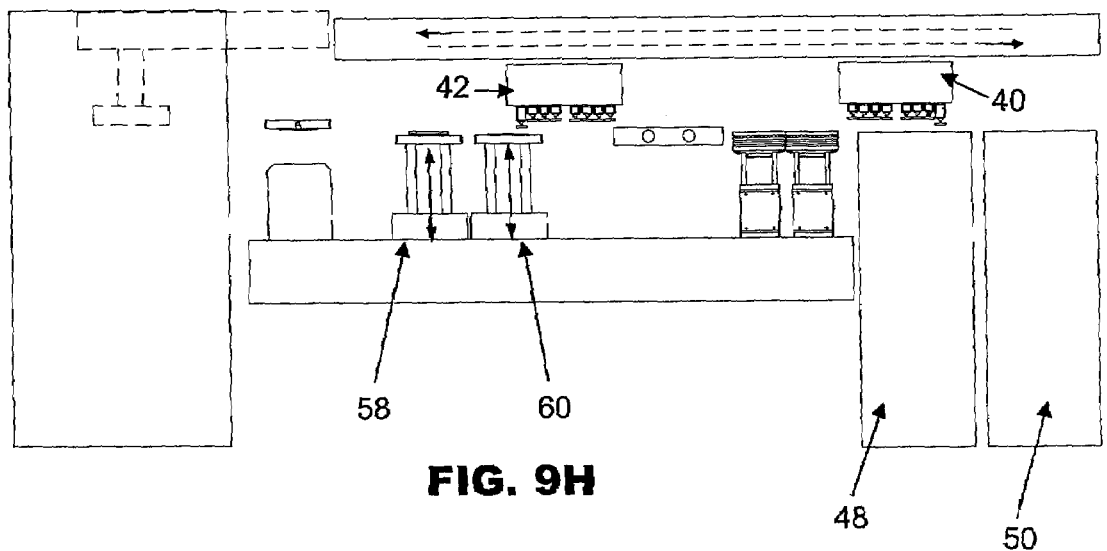

In FIG. 9H, the last offloading pick head 53 on the second offloading arm 42 picks up a package 12 from the second buffer boat 60. The steps described with reference to FIGS. 9D to 9H are repeated until all packages on the second buffer boat 60 are picked by the first and second offloading arms 40, 42. At the same time, the first offloading arm 40 moves to the offloaders 48, 50 for offloading the picked packages 12 after ball inspection of the packages 12 is completed. The first buffer boat 58 follows the same sequence as the second buffer boat 60 in transferring the packages 12 held on the flipping platform 56 to the dual buffer boats 58, 60. The cycle is repeated from FIG. 9A to 9H for another strip of singulated packages transferred by the unloading arm 22.

It should be appreciated that the preferred embodiments described above provides a simple apparatus and method for handling singulated packages such as BGA and QFN packages. Full inspection of all the surfaces of QFN packages is also possible.

Simultaneous processing of multiple singulated packages 12 can be conducted, including package pick-up, mold surface inspection, ball or five sides inspection and offloading, which reduces cycle time. The use of multiple offloading pick heads 52, 53 on the linear offloading arms 40, 42 speeds up the pick and place process. Further, the use of at least two optical systems 54 for five-sides inspection of QFN packages 12 allows simultaneous inspection of at least two groups of packages 12. This reduces cycle time significantly.

Another time-saving factor is provided by the gang précisor 44 which allows for simultaneous angular alignment of a row of packages 12 at once, thus maintaining consistency in the orientation of the packages 12. The package hand-over frequency, excluding the pick-up from the tape or transfer from the singulation jig, gang transfer and offloading to the offloaders 48, 50, is reduced substantially. Therefore, the reliability and stability of material handling is greatly improved.

Additionally, the package yield is increased significantly in the first embodiment of the invention that is applicable to mounting tapes as the quadruple rotary pick arms 16 are able to rotate within an angular range of between for example, 30° to 60° instead of only stopping at a 45° orientation, so that the optical path of the PR alignment optical system 32 is not blocked by the two adjacent pick heads 28. That is, on-the-fly PR alignment can be conducted. The cycle time per unit is reduced and thus a higher system throughput and productivity is achievable.

The package flipping feature in the second embodiment of the invention that is applicable to singulation jigs provides a further advantage to the invention as flipping the packages 12 at an earlier part of the package handling process allows easier and more sturdy handling of the packages 12, since the flat bottom surfaces of the packages 12 are held instead of the ball side or upper side which typically has components on top. The overall mechanism utilized is also less complex compared to the aforesaid prior art. The conversion parts are fewer, so that the overall cost of the system is reduced.

The invention described herein is susceptible to variations, modifications and/or additions other than those specifically described and it is to be understood that the invention includes all such variations, modifications and/or additions which fall within the spirit and scope of the above description.

The invention claimed is:

1. A semiconductor package handling system comprising:
a package holder configured to receive and hold singulated semiconductor packages;
a first inspection device arranged and configured to inspect a first surface of the packages while they are being held by the package holder;
an offloading device configured to receive the packages from the package holder and to convey the packages to an offloader, wherein the offloading device comprises first and second offloading arms that are configured so that each offloading arm moves in a linear path between the package holder and the offloader, each offloading arm comprising a single row of offloading pick heads, each pick head being configured to hold one package and to convey the package to the offloader, the pick heads of the first and second offloading arms being arranged such that pick and place points of the pick heads lie along the same center line, the pick heads of the first offloading arm being arranged below the pick heads of the second offloading arm to prevent collision between the pick heads of the first offloading arm and the pick heads of the second offloading arm when each offloading arm moves in a linear path between the package holder and the offloader; and
a second inspection device arranged and configured to inspect a second surface of the packages, which is opposite from the first surface, while they are being held by the offloading device, the first offloading arm being offset on a first side of the center line in plan view with the pick and place points of its offloading pick heads on the center line, and the second offloading arm being offset on a second side of the center line in plan view with the pick and place points of its offloading pick heads on the center line, the second side being opposite to the first side.

2. The semiconductor package handling system as claimed in claim 1, wherein the package holder is operative to pick up individual singulated semiconductor packages that have been mounted on an adhesive tape.

3. The semiconductor package handling system as claimed in claim 1, wherein the package holder comprises rotary pick arms.

4. The semiconductor package handling system as claimed in claim 3, wherein the rotary pick arms comprise four rotary pick heads that are equally spaced from one another.

5. The semiconductor package handling system as claimed in claim 4, wherein the rotary pick arms are driven by a direct drive motor with a hollow shaft at a center of the direct drive motor, and the hollow shaft further comprises a pattern recognition (PR) alignment optical system for determining an alignment of each package relative to the rotary pick head.

6. The semiconductor package handling system as claimed in claim 5, wherein the rotary pick heads are configured such that a view of a package by the PR alignment optical system is blocked by one rotary pick head of the rotary pick heads at a pick-up position of the rotary pick head, and the package is viewable between adjacent rotary pick heads when the rotary pick head is offset from the pick-up position.

7. The semiconductor package handling system as claimed in claim 4, wherein the offloading device is operative to receive a package from one rotary pick head of the rotary pick heads while the first inspection device is inspecting another package held by another rotary pick head.

8. The semiconductor package handling system as claimed in claim 1, wherein each offloading pick head is configured to be independently projectable relative to the other offloading pick heads.

9. The semiconductor package handling system as claimed in claim 1, wherein the offloading pick heads are arranged in two separate groups.

10. The semiconductor package handling system as claimed in claim 9, wherein the second inspection device comprises two cameras such that a pitch between the centers of the two cameras corresponds to a pitch between respective offloading pick heads comprised in the two separate groups of offloading pick heads.

11. The semiconductor package handling system as claimed in claim 1, further comprising a gang précisor comprising a pair of parallel bars which close onto the packages held by the offloading device so as to align all the packages held by the offloading device simultaneously.

* * * * *